(12) United States Patent
Baek et al.

(10) Patent No.: US 9,024,668 B1
(45) Date of Patent: May 5, 2015

(54) CLOCK GENERATOR

(71) Applicant: SK Hynix Inc., Icheon-si Gyeonggi-do (KR)

(72) Inventors: Seung Geun Baek, Icheon-si (KR); Hyun Woo Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/189,401

(22) Filed: Feb. 25, 2014

(30) Foreign Application Priority Data

Dec. 2, 2013 (KR) .................. 10-2013-0148511

(51) Int. Cl.
| | | |
|---|---|---|
| *H03L 7/06* | (2006.01) | |
| *H03K 5/06* | (2006.01) | |
| *G05F 1/46* | (2006.01) | |
| *H03L 7/08* | (2006.01) | |
| *H03K 3/012* | (2006.01) | |

(52) U.S. Cl.
CPC .. *H03K 5/06* (2013.01); *G05F 1/46* (2013.01); *H03L 7/0802* (2013.01); *H03K 3/012* (2013.01)

(58) Field of Classification Search
USPC ................. 327/156, 158, 333; 326/80, 81
See application file for complete search history.

(56) References Cited

U.S. PATENT DOCUMENTS

| | | | | |
|---|---|---|---|---|
| 5,936,455 | A * | 8/1999 | Kobayashi et al. | 327/437 |
| 5,973,508 | A * | 10/1999 | Nowak et al. | 326/81 |
| 6,844,769 | B2 * | 1/2005 | Yamamoto et al. | 327/333 |
| 7,594,127 | B2 * | 9/2009 | Sutardja | 713/300 |
| 7,788,510 | B2 * | 8/2010 | Sutardja | 713/300 |
| 7,929,406 | B1 * | 4/2011 | Voo | 713/300 |
| 8,115,336 | B1 * | 2/2012 | Voo | 307/36 |
| 8,138,815 | B2 * | 3/2012 | Taddiken et al. | 327/333 |
| 2006/0119390 | A1 * | 6/2006 | Sutardja | 326/62 |
| 2007/0040601 | A1 * | 2/2007 | Lee | 327/540 |
| 2009/0230947 | A1 * | 9/2009 | Sumita | 324/76.11 |
| 2010/0148758 | A1 * | 6/2010 | Lo et al. | 324/140 R |
| 2011/0316599 | A1 * | 12/2011 | Kwak | 327/158 |

FOREIGN PATENT DOCUMENTS

KR 1020100123234 A 11/2010

* cited by examiner

*Primary Examiner* — Ryan Jager
(74) *Attorney, Agent, or Firm* — William Park & Associates Ltd.

(57) ABSTRACT

A clock generation circuit of a semiconductor apparatus includes a first clock generation unit configured to output a first signal which swings between a level of a power supply voltage and a level of a set voltage; a second clock generation unit configured to output a second signal which swings between the level of the set voltage and a level of a ground voltage; and a regulator configured to supply the set voltage to the first clock generation unit and the second clock generation unit.

14 Claims, 9 Drawing Sheets

9,024,668 B1

CLOCK GENERATOR

CROSS-REFERENCES TO RELATED APPLICATION

The present application claims priority under 35 U.S.C. §119(a) to Korean application number 10-2013-0148511, filed on Dec. 2, 2013, in the Korean Intellectual Property Office, which is incorporated herein by reference in its entirety.

TECHNICAL FIELD

Various embodiments relate to a semiconductor apparatus, and more particularly, to a clock generation circuit of a semiconductor apparatus with reduced power consumption.

BACKGROUND

Semiconductor apparatuses may be used for storing data. When semiconductor apparatuses are used for storing data, semiconductor apparatuses may be classified into a nonvolatile semiconductor apparatus and a volatile semiconductor apparatus.

In the case of a nonvolatile semiconductor apparatus, stored data may be retained without being lost even though power is not applied to the nonvolatile semiconductor apparatus. Examples of the nonvolatile semiconductor apparatus include a flash memory device, a ferroelectric random access memory (FRAM), a phase-change random access memory (PRAM), a magnetic random access memory (MRAM) and a resistive random access memory (RRAM).

Conversely, in the case of a volatile semiconductor apparatus, data stored while power is applied may be lost if power is not applied to the volatile semiconductor apparatus. Examples of the volatile semiconductor apparatus include a static random access memory (SRAM) and a dynamic random access memory (DRAM).

In order to evaluate operation performance of a semiconductor, for example, a processing speed, power consumption, and so forth may be considered. Semiconductor apparatuses have been developed to satisfy a higher processing speed and a lower amount of power consumption.

SUMMARY

In an embodiment, a clock generation circuit of a semiconductor apparatus may include: a first clock generation unit configured to output a first signal which swings between a level of a power supply voltage and a level of a set voltage; a second clock generation unit configured to output a second signal which swings between the level of the set voltage and a level of a ground voltage; and a regulator configured to supply the set voltage to the first clock generation unit and the second clock generation unit.

In an embodiment, a clock generation circuit of a semiconductor apparatus may include: a first delay-locked loop electrically coupled between a terminal of a power supply voltage and a node, and configured to compensate for an amount by which a first clock is delayed by internal circuits and generate a first delayed clock; a second delay-locked loop electrically coupled between the node and a terminal of a ground voltage, and configured to compensate for an amount by which a second clock is delayed by the internal circuits and generate a second delayed clock; and a regulator configured to retain a voltage level of the node at a level of a set voltage.

In an embodiment, a clock generation circuit of a semiconductor apparatus may include: a first delay line configured to delay a first clock and generate a first delayed clock which swings between a level of a power supply voltage and a level of a set voltage; a second delay line configured to delay a second clock and generate a second delayed clock which swings between the level of the set voltage and a level of a ground voltage; and a regulator configured to supply the set voltage to the first delay line and the second delay line.

BRIEF DESCRIPTION OF THE DRAWINGS

Features, aspects, and embodiments are described in conjunction with the attached drawings, in which.

DETAILED DESCRIPTION

Hereinafter, a clock generation circuit of a semiconductor apparatus will be described below with reference to the accompanying drawings through various embodiments.

Figure 1:
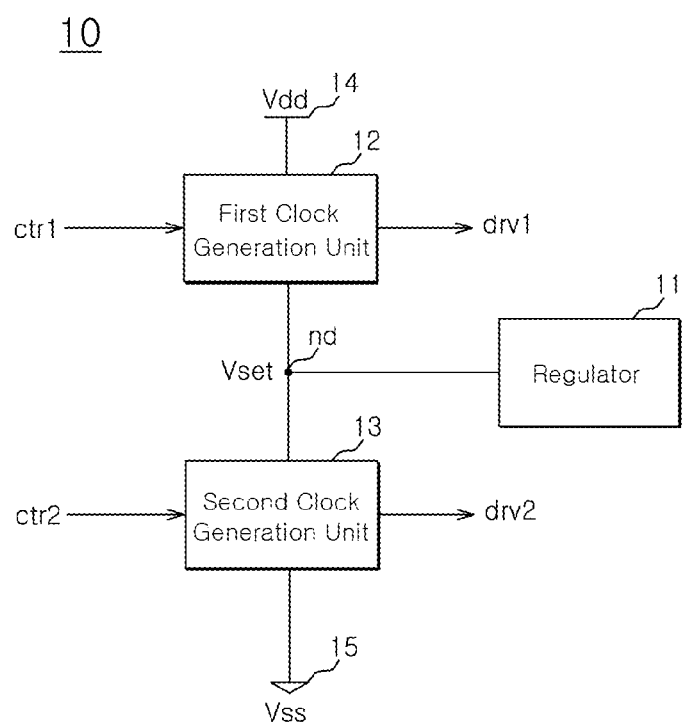
FIG. 1 is a block diagram showing a clock generation circuit of a semiconductor apparatus in accordance with an embodiment.

FIG. 1 is a block diagram showing a clock generation circuit of a semiconductor apparatus in accordance with an embodiment.

A clock generation circuit 10 of FIG. 1 may include a regulator 11, a first clock generation unit 12, and a second clock generation unit 13.

The regulator 11 may be electrically coupled to a node nd. The regulator 11 may be configured to substantially constantly retain the voltage level of the node nd at the level of a set voltage Vset. The regulator 11 may be configured to supply the set voltage Vset to the first clock generation unit 12 and the second clock generation unit 13. The level of the set voltage Vset may be a value between the level of a ground voltage Vss and the level of a power supply voltage Vdd. For example, the level of the set voltage Vset may be the half level of the power supply voltage Vdd.

The first clock generation unit 12 may be electrically coupled between a power supply voltage terminal 14 and the node nd. The first clock generation unit 12 may be configured to drive between the level of the power supply voltage Vdd and the level of the set voltage Vset, in response to a first control signal ctr1. That is to say, the first clock generation unit 12 may output a first signal drv1 which swings between the level of the power supply voltage Vdd and the level of the set voltage Vset, in response to the first control signal ctr1.

The second clock generation unit 13 may be electrically coupled between the node nd and a ground voltage terminal 15. The second clock generation unit 13 may be configured to drive between the level of the set voltage Vset and the level of the ground voltage Vss, in response to a second control signal ctr2. That is to say, the second clock generation unit 13 may output a second signal drv2 which swings between the level of the set voltage Vset and the level of the ground voltage Vss, in response to the second control signal ctr2.

Figure 2:
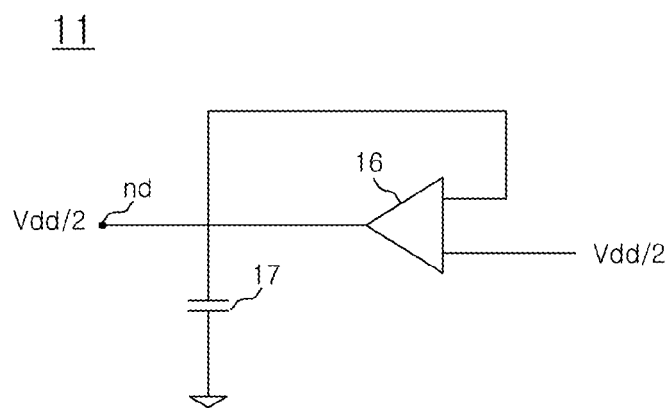
FIG. 2 is a circuit diagram showing the regulator shown in FIG. 1.

FIG. 2 is a circuit diagram showing the regulator 11 of FIG. 1. FIG. 2 shows the case where the level of the set voltage Vset is the half level of the power supply voltage Vdd.

The regulator 11 may include a comparator 16 and a capacitor 17.

The comparator 16 may be supplied with a half power supply voltage Vdd/2, may be fed back with an output electrically coupled to the node nd, through an input terminal thereof, and may retain the voltage level of the node nd at the half level of the power supply voltage Vdd.

The capacitor 17 may mean a capacitance component which is included in the regulator 11. The capacitor 17 may be charged and discharged to retain the voltage level of the node nd at the half level of the power supply voltage Vdd.

Figure 3:
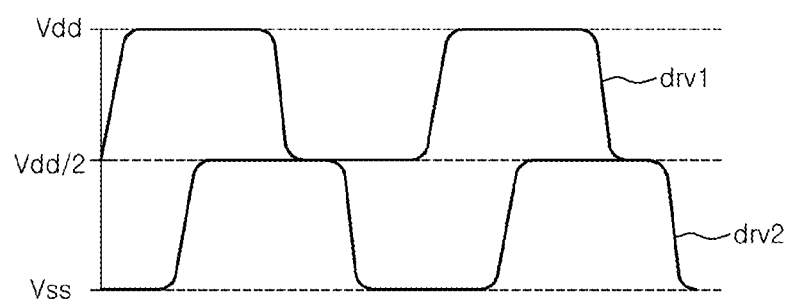
FIG. 3 is a waveform diagram showing the waveforms of signals which are outputted by the first clock generation unit and the second clock generation unit shown in FIG. 1.

FIG. 3 is a waveform diagram showing the waveforms of signals which are outputted by the first clock generation unit and the second clock generation unit of FIG. 1.

When the level of the set voltage Vset is, for example, the half level of the power supply voltage Vdd, the first signal drv1 outputted from the first clock generation unit 12 may swing between the level of the power supply voltage Vdd and the half level of the power supply voltage Vdd. The second signal drv2 outputted from the second clock generation unit 13 may swing between the half level of the power supply voltage Vdd and the level of the ground voltage Vss.

The first clock generation unit 12 and the second clock generation unit 13 may be internal circuits of a semiconductor circuit. In the case where the first signal drv1 and the second signal drv2 are generated such that the swing width thereof corresponds to the magnitude of the half power supply voltage Vdd/2, the power consumption amount of the clock generation circuit may be reduced when compared to the case where the first signal drv1 and the second signal drv2 are generated such that the swing width thereof corresponds to the magnitude of the power supply voltage Vdd.

Figure 4:
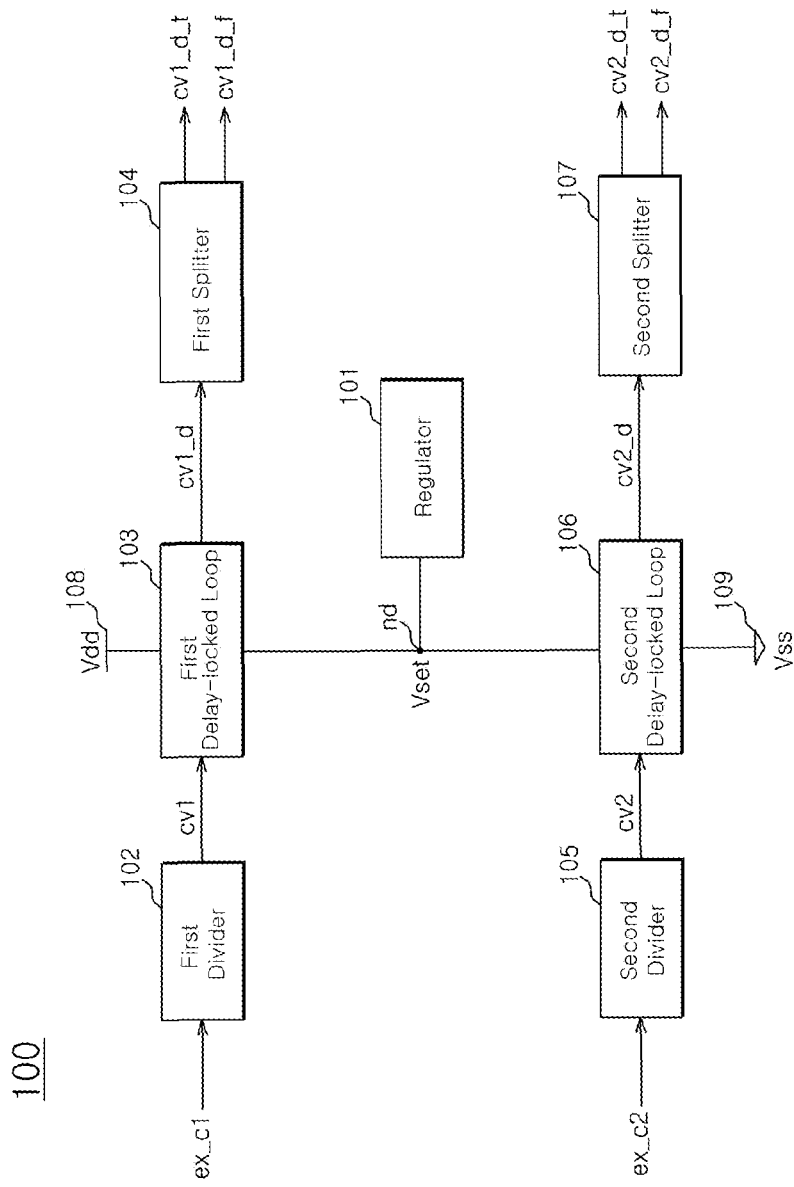
FIG. 4 is a block diagram showing a clock generation circuit of a semiconductor apparatus in accordance with an embodiment.

FIG. 4 is a block diagram showing a clock generation circuit of a semiconductor apparatus in accordance with an embodiment.

A clock generation circuit 100 of FIG. 4 may include a regulator 101, a first divider 102, a first delay-locked loop 103, a first splitter 104, a second divider 105, a second delay-locked loop 106, and a second splitter 107.

The regulator 101 may be electrically coupled to a node nd which is electrically coupled to the first delay-locked loop 103 and the second delay-locked loop 106. The regulator 101 may be configured to constantly retain the voltage level of the node nd at the level of a set voltage Vset. The regulator 101 may supply the set voltage Vset to the first delay-locked loop 103 and the second delay-locked loop 106. The level of the set voltage Vset may be a value between the level of a ground voltage Vss and the level of a power supply voltage Vdd. For example, the level of the set voltage Vset may be the half level of the power supply voltage Vdd.

The first divider 102 may be configured to divide by 2 an external clock ex_c1 and generate and output a first clock cv1.

The first delay-locked loop 103 may be configured to receive the first clock cv1. The first delay-locked loop 103 may be configured to delay the first clock cv1 and generate a first delayed clock cv1_d. In detail, the first delay-locked loop 103 may generate the first delayed clock cv1_d by compensating for an amount by which the first clock cv1 is delayed by the internal circuits of a memory. The first delay-locked loop 103 may be electrically coupled between a power supply voltage terminal 108 and the node nd. Accordingly, the first delay-locked loop 103 may generate the first delayed clock cv1_d which swings between the level of the power supply voltage Vdd and the level of the set voltage Vset.

The first splitter 104 may be configured to receive the first delayed clock cv1_d and output a first positive delayed clock cv1_d_t and a first negative delayed clock cv1_d_f which is generated by inverting the first positive delayed clock cv1_d_t.

The second divider 105 may be configured to divide by 2 an inverted external clock ex_c2 and generate and output a second clock cv2.

The second delay-locked loop 106 may be configured to receive the second clock cv2. The second delay-locked loop 106 may be configured to delay the second clock cv2 and generate a second delayed clock cv2_d. In detail, the second delay-locked loop 106 may generate the second delayed clock cv2_d by compensating for an amount by which the second clock cv2 is delayed by the internal circuits of the memory. The second delay-locked loop 106 may be electrically coupled between the node nd and a ground voltage terminal 109. Accordingly, the second delay-locked loop 106 may generate the second delayed clock cv2_d which swings between the level of the set voltage Vset and the level of the ground voltage Vss.

The second splitter 107 may be configured to receive the second delayed clock cv2_d and output a second positive delayed clock cv2_d_t and a second negative delayed clock cv2_d_f which is generated by inverting a second positive delayed clock cv2_d_t.

A memory, for example, in the case of outputting data, may output data in synchronization with the first positive delayed clock cv1_d_t, the first negative delayed clock cv1_d_f, the second positive delayed clock cv2_d_t and the second negative delayed clock cv2_d_f, such that the data to be outputted may be synchronized with the external clock ex_c1.

Figure 5:
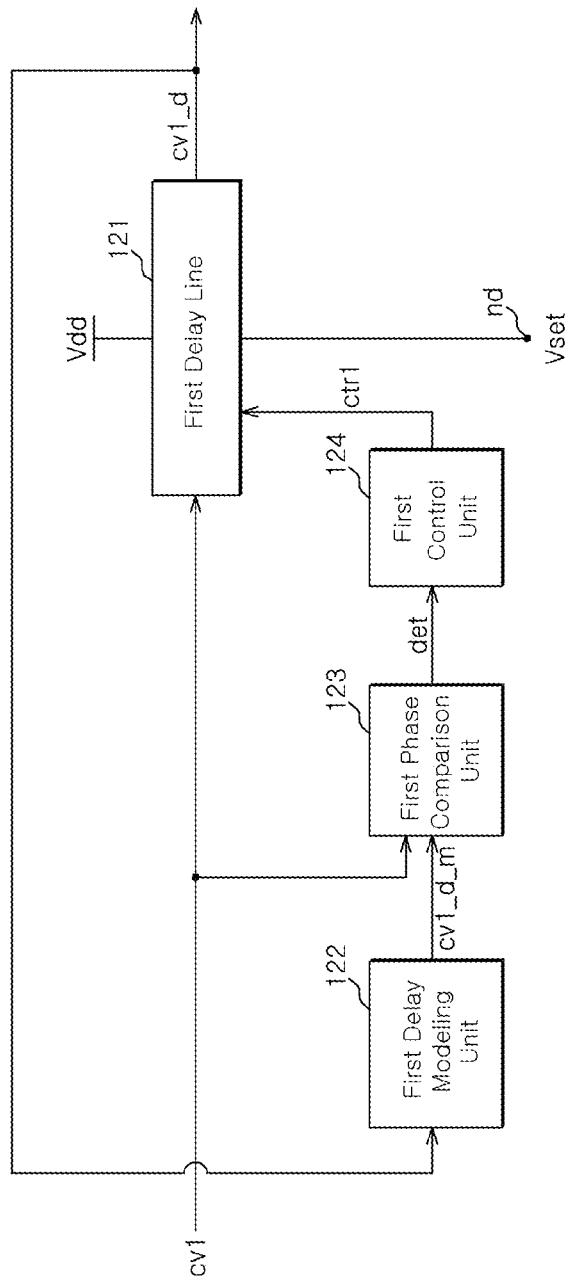
FIG. 5 is a block diagram showing the first delay-locked loop shown in FIG. 4.

FIG. 5 is a block diagram showing the first delay-locked loop 103 of FIG. 4.

The first delay-locked loop 103 may include a first delay line 121, a first delay modeling unit 122, a first phase comparison unit 123, and a first control unit 124. The first delay line 121 may be configured to delay the first clock cv1 by a predetermined delay amount in response to a first control signal ctr1, and output the first delayed clock cv1_d. The first delay line 121 may be electrically coupled between a terminal of the power supply voltage Vdd and the node nd. The first delay modeling unit 122 may be configured to delay the first delayed clock cv1_d by a model delay amount as a delay amount which is caused in transmission paths of clocks, and output a first delay modeling clock cv1_d_m. The first phase comparison unit 123 may be configured to compare the phases of the first clock cv1 and the first delay modeling clock cv1_d_m, and output a comparison signal det. The first control unit 124 may be configured to output the first control signal ctr1 in response to the comparison signal det such that a delay amount for compensating for an amount by which the first clock cv1 is delayed by the internal circuits of the memory is set.

The configuration and operating method of the second delay-locked loop 106 may be similar to the first delay-locked loop 103. A second delay line which is included in the second delay-locked loop 106 may be electrically coupled between the node nd and a terminal of the ground voltage Vss. Therefore, detailed descriptions thereof will be omitted herein.

Figure 6:
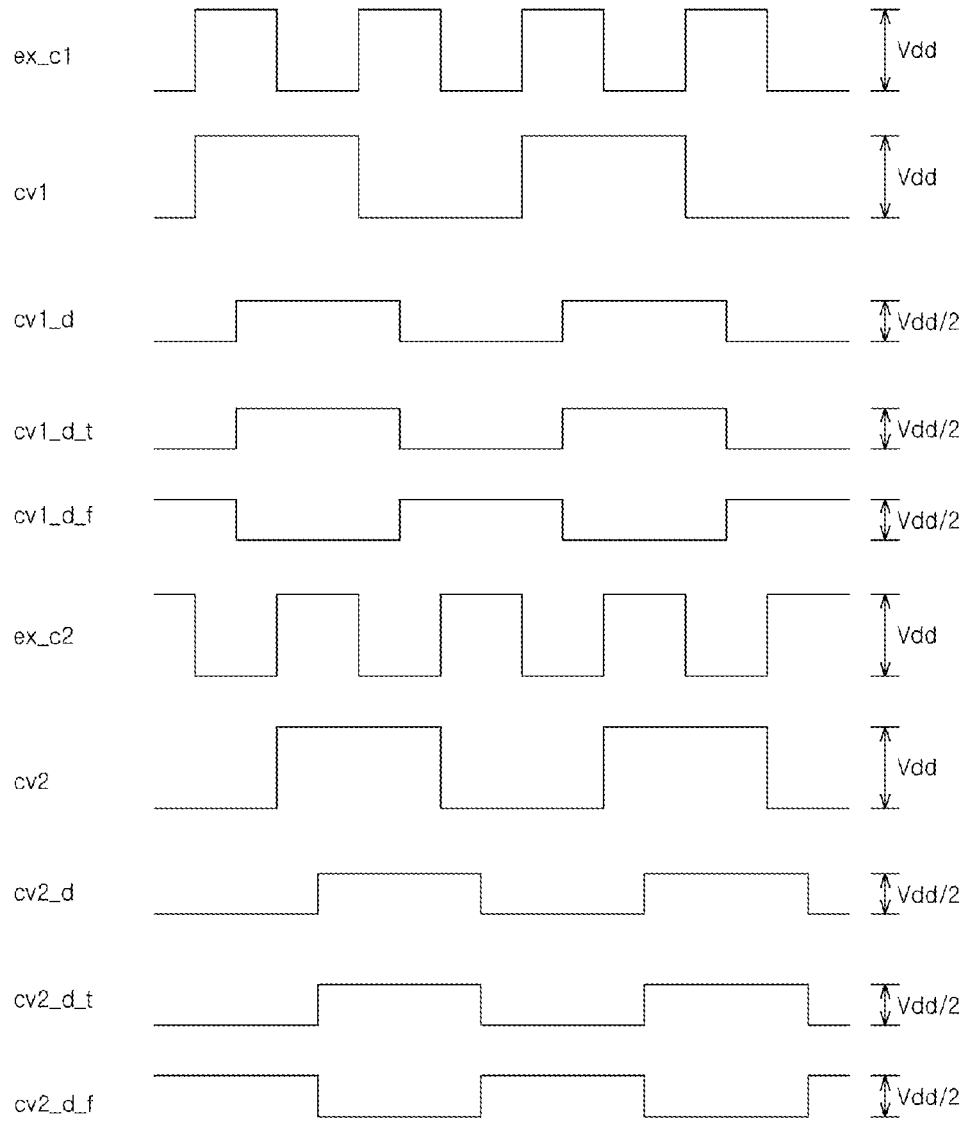
FIG. 6 is a waveform diagram showing the clocks transmitted in the clock generation circuit shown in FIG. 4.

FIG. 6 is a waveform diagram showing the clocks transmitted in the clock generation circuit 100 of FIG. 4. FIG. 6 is shown on the assumption that the level of the set voltage Vset is the half level of the power supply voltage Vdd.

The external clock ex_c1 with the swing width of Vdd may be divided by 2 by the first divider 102, and the first clock cv1 with a swing width of Vdd may be generated. The first clock cv1 may be delayed by the predetermined delay amount by the first delay-locked loop 103, and the first delayed clock cv1_d with the swing width of Vdd/2 may be generated. The first positive delayed clock cv1_d_t and the first negative delayed clock cv1_d_f with the swing width of Vdd/2 may be generated from the first delayed clock cv1_d by the first splitter 104.

The inverted external clock ex_c2 with the swing width of Vdd may be divided by 2 by the second divider 105, and the second clock cv2 with a swing width of Vdd may be generated. The second clock cv2 may be delayed by the predetermined delay amount by the second delay-locked loop 106, and the second delayed clock cv2_d with the swing width of Vdd/2 may be generated. The second positive delayed clock cv2_d_t and the second negative delayed clock cv2_d_f with the swing width of Vdd/2 may be generated from the second delayed clock cv2_d by the second splitter 107.

According to an embodiment, when considering an external clock with a frequency ω and a swing width a, internal clocks with a frequency ω/2, a swing width a/2 and four different phases, for example, 0°, 90°, 180° and 270°, may be generated.

In the case where clocks are generated such that the swing width thereof corresponds to, for example, the magnitude of a half power supply voltage Vdd/2, according to an embodiment, the power consumption amount of a clock generation circuit may be reduced when compared to the case where the clocks are generated such that the swing width thereof corresponds to the magnitude of a power supply voltage Vdd.

First, for example, in the case where clocks are generated such that the swing width thereof corresponds to the magnitude of the power supply voltage Vdd, the power consumed by the first delay-locked loop 103 may be expressed by the following equation (1).

$$\text{Power}_1 = (\omega/2) * C * (Vdd)^2 \tag{1}$$

Here, ω is the frequency of the external clock ex_c1. C may be a reactance value that is induced in the first delay-locked loop 103.

In the case where clocks are generated such that the swing width thereof corresponds to the magnitude of the power supply voltage Vdd, the power consumed by the second delay-locked loop 106 may also be expressed similarly to the above equation (1).

Therefore, in the case where clocks are generated such that the swing width thereof corresponds to the magnitude of the power supply voltage Vdd, the power consumed by the first delay-locked loop 103 and the second delay-locked loop 106 may be expressed by the following equation (2).

$$\text{Power}_2 = 2 * (\omega/2) * C * (Vdd)^2 \tag{2}$$

Unlike this, in the case where clocks are generated such that the swing width thereof corresponds to the magnitude of the half power supply voltage Vdd/2, in accordance with an embodiment, the power consumed by the first delay-locked loop 103 and the second delay-locked loop 106 may be expressed by the following equation (3).

$$\text{Power}_3 = 2 * (\omega/2) * C * (Vdd/2)^2 \tag{3}$$

It may be seen that ¼ is added as a factor when compared to the equation (2). In other words, in accordance with an embodiment, a power consumption amount may be reduced.

In the case of decreasing the swing width of a clock with a high frequency, invulnerableness to noise and a jitter may be caused. In accordance with an embodiment, since swing width control is performed for clocks with a low frequency due to division of the external clock ex_c1 with a high frequency, such invulnerableness may not be caused.

Figure 7:
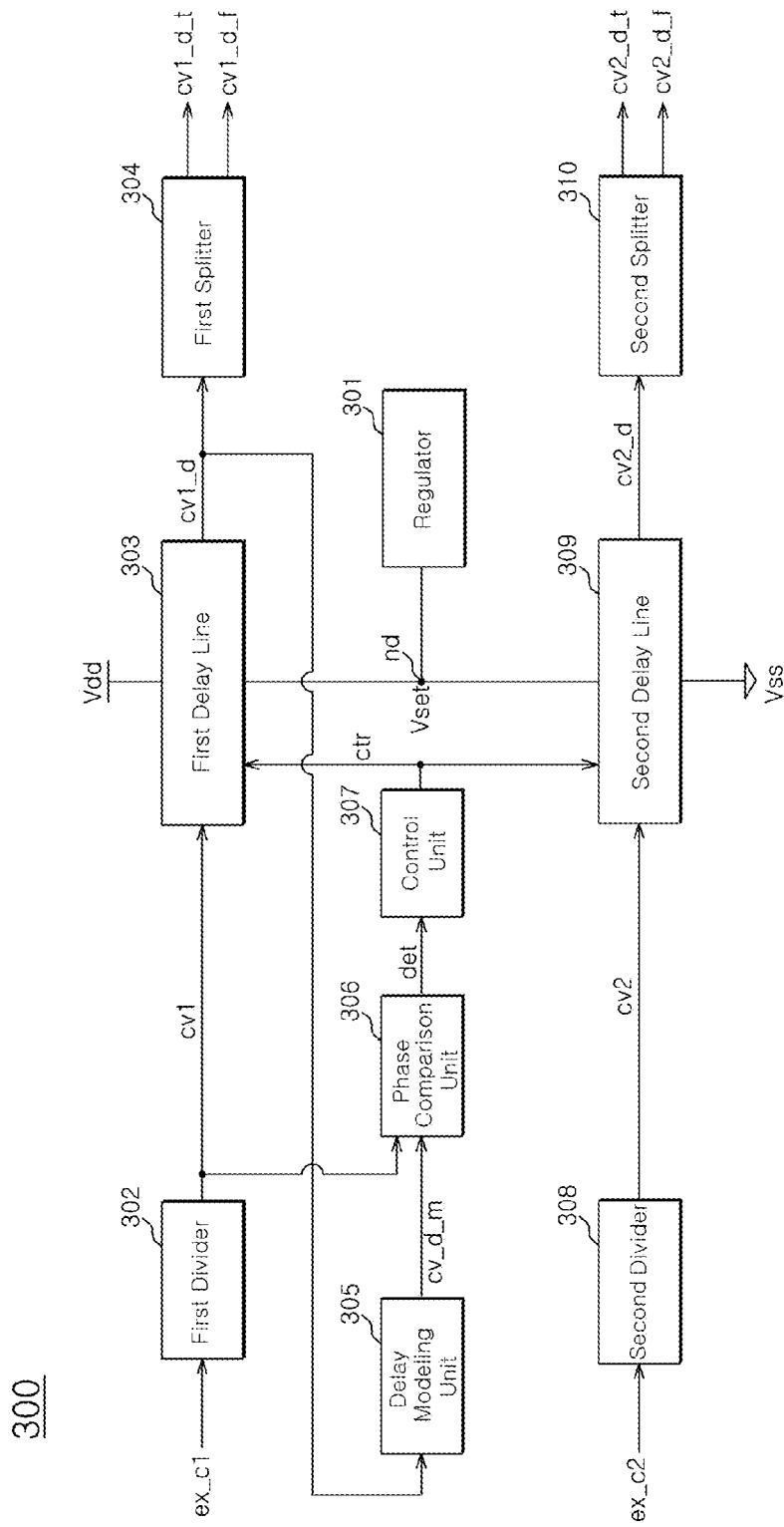
FIG. 7 is a block diagram showing a clock generation circuit of a semiconductor apparatus in accordance with an embodiment.

FIG. 7 is a block diagram showing a clock generation circuit of a semiconductor apparatus in accordance with an embodiment.

In the clock generation circuit 100 of FIG. 4, since the first delay-locked loop 103 and the second delay-locked loop 106 respectively operate, delay amounts may be set for the first delay-locked loop 103 and the second delay-locked loop 106, respectively. In the clock generation circuit 300 of FIG. 7, the same delay amount may be set for a first delay line 303 and a second delay line 309 by one control unit 307.

The clock generation circuit 300 of FIG. 7 may include a regulator 301, a first divider 302, the first delay line 303, a first splitter 304, a delay modeling unit 305, a phase comparison unit 306, the control unit 307, a second divider 308, the second delay line 309, and a second splitter 310.

The configurations and operating methods of the regulator 301, the first divider 302, the first splitter 304, the second divider 308 and the second splitter 310 may be similar to the configurations and operating methods described above with reference to FIG. 4. The regulator 301 may retain the voltage level of the node nd at the level of the set voltage Vset, wherein the node nd may be electrically coupled to the first delay line 303 and the second delay line 309 at the level of the set voltage Vset.

The first delay line 303 may be configured to delay a first clock cv1 by a predetermined delay amount in response to a control signal ctr, and output a first delayed clock cv1_d. The delay modeling unit 305 may be configured to delay the first delayed clock cv1_d by a model delay amount as a delay amount which is caused in transmission paths of clocks, and output a delay modeling clock cv_d_m. The phase comparison unit 306 may be configured to compare the phases of the first clock cv1 and the delay modeling clock cv_d_m, and output a comparison signal det. In an embodiment, the phase comparison unit 306 may be configured to compare phases of the second clock cv2 and the delay modeling clock cv_d_m and output a comparison signal det. The control unit 307 may be configured to output the control signal ctr in response to the comparison signal det, to control the first delay line 303 and the second delay line 309 in the same manner. Namely, the control unit 307 may be configured to output the control signal ctr in response to the comparison signal det, such that the same delay amount is set for the first delay line 303 and the second delay line 309. The second delay line 309 may be configured to delay the second clock cv2 by a predetermined delay amount and generate and output a second delayed clock cv2_d in response to a control signal ctr. The regulator 301 may be configured to supply the set voltage Vset to the first delay line 303 and the second delay line 309.

Figure 8:
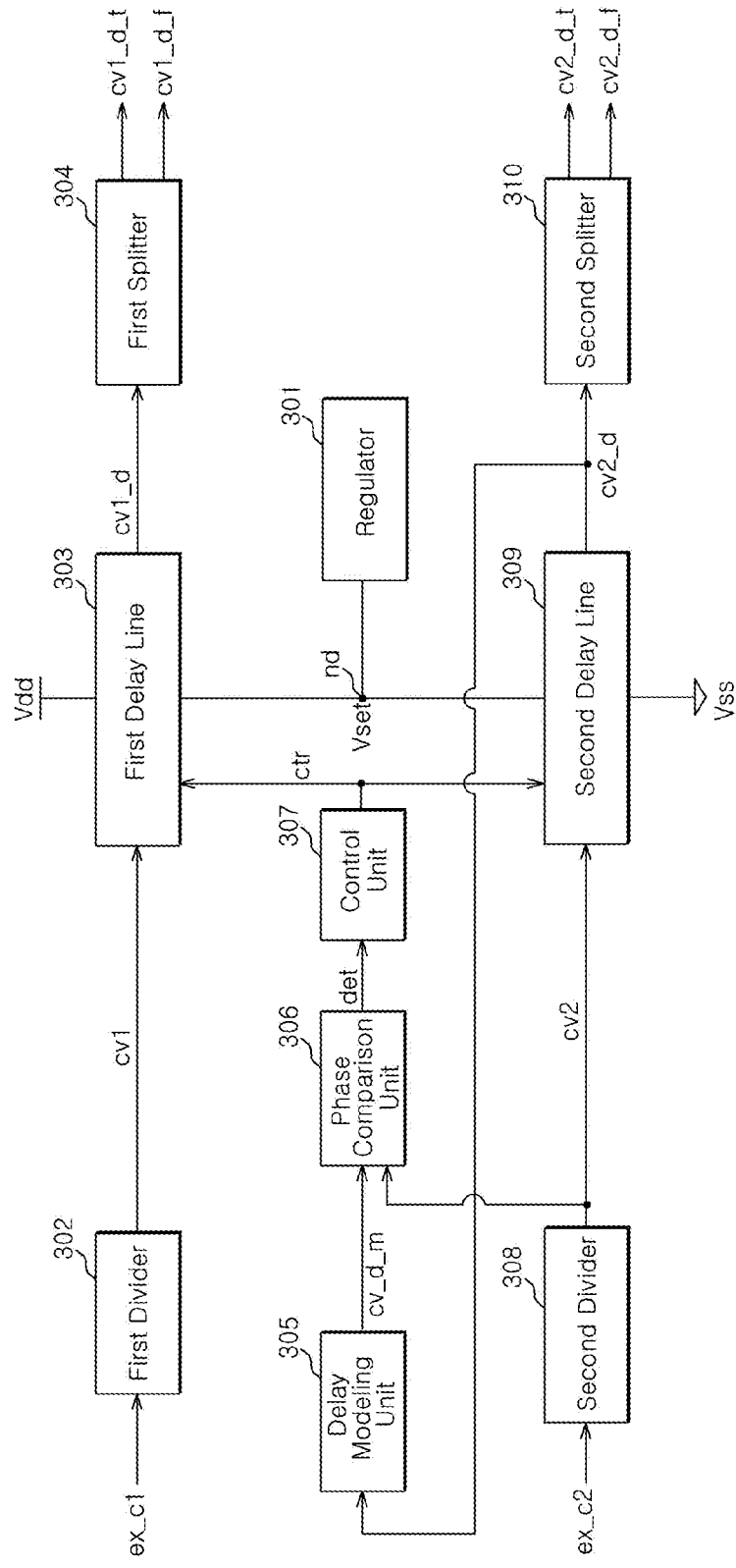
FIG. 8 is a block diagram showing a clock generation circuit of a semiconductor apparatus in accordance with an embodiment.

According to an embodiment described above with reference to FIG. 7, a delay modeling unit 305 may receive a first delayed clock cv1_d and output the first delayed clock cv1_d as a delay modeling clock cv_d_m. Unlike this, according to an embodiment illustrated in FIG. 8, a delay modeling unit 305 may receive not a first delayed clock cv1_d but a second delayed clock cv2_d; delay the second delayed clock cv2_d by a model delay amount; and output the second delayed clock cv2_d as a delay modeling clock cv_d_m. In this case, the configurations and operating methods of the remaining component elements are similar as described above with reference to FIG. 7, except that the delay modeling unit 305 receives the second delayed clock cv2_d. Therefore, detailed descriptions thereof will be omitted herein.

In FIG. 4, there may be a case where the power consumption amounts of the first delay-locked loop 103 and the second delay-locked loop 106 are different from each other. Because the first delay-locked loop 103 and the second delay-locked loop 106 of FIG. 4 may respectively operate and delay amounts may be respectively set for the first delay-locked loop 103 and the second delay-locked loop 106, the amounts of power consumed during the operations thereof may be different from each other. Similarly, in FIG. 7, there may be a case where the power consumption amounts of the first delay line 303 and the second delay line 309 are different from each other. In the clock generation circuit 300 of FIG. 7, because a delay amount may be set by receiving the output of only the first delay line 303 between the first delay line 303 and the second delay line 309 through the delay modeling unit 305, the amounts of power consumed by the first delay line 303 and the second delay line 309 may be different from each other. The first delay line 303 may be electrically coupled between a terminal of the power supply voltage Vdd and the node nd. The second delay line 309 may be electrically coupled between the node nd and a terminal of the ground voltage Vss.

However, although, as described above, there may be a case where the amounts of power consumed by the first delay-locked loop 103 and the second delay-locked loop 106 or the first delay line 303 and the second delay line 309 are different from each other, since a difference thereof is not large, a burden exerted on the regulator 101 or 301 to supply power is not so large. Therefore, the regulator 101 or 301 may effectively retain the voltage level of the node nd at the level of the set voltage Vset, wherein the node nd may be electrically coupled to the first delay line 303 and the second delay line 309 at the level of the set voltage Vset as illustrated in FIG. 7.

Figure 9:
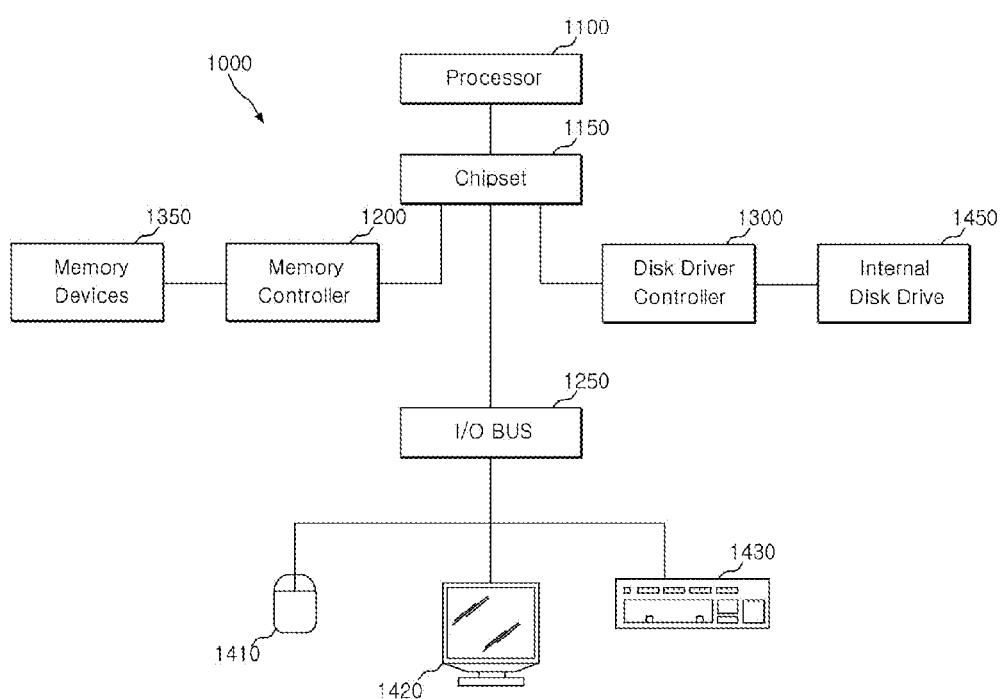
FIG. 9 illustrates a block diagram of a system employing a memory controller circuit in accordance with an embodiment.

Referring to FIG. 9, a system 1000 may include one or more processors 1100. The processor 1100 may be used individually or in combination with other processors. A chipset 1150 may be operably coupled to the processor 1100. The chipset 1150 is a communication pathway for signals between the processor 1100 and other components of the system 1000. Other components may include a memory controller 1200 and an input/output ("I/O") bus 1250. A number of different signals may be transmitted through the chipset 1150.

The memory controller 1200 may be electrically coupled to the chipset 1150. The memory controller 1200 can receive a request provided from the processor 1100 through the chipset 1150. The memory controller may also be electrically coupled to one or more memory devices 1350. The memory device 1350 can correspond to the semiconductor apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or the chipset 1150 using virtually any type of communication protocol.

As is apparent from the above descriptions, a clock generation circuit of a semiconductor apparatus in accordance with an embodiment may include one regulator which is configured to retain the voltage level of a node between the terminal of a power supply voltage and the terminal of a ground voltage, at the level of a set voltage. Further, the clock generation circuit may include two clock generation units or two delay-locked loops which are configured to generate a signal swinging between the level of the power supply voltage; and the level of the set voltage and a signal swinging between the level of the set voltage and the level of the ground voltage. However, a clock generation circuit of a semiconductor apparatus in accordance with an embodiment may include two regulators which are respectively electrically coupled to a first node; and a second node between the terminal of a power supply voltage and the terminal of a ground voltage. In this case, the two regulators may be configured to retain the voltage levels of the first and second nodes at the levels of set voltages. In this case, the clock generation circuit may include three clock generation units or three delay-locked loops which are configured to respectively generate a signal swinging between the level of the power supply voltage and the voltage level of the first node; a signal swinging between the voltage level of the first node and the voltage level of the second node; and a signal swinging between the voltage level of the second node and the level of the ground voltage. A clock generation circuit of a semiconductor apparatus in accordance with an embodiment may be configured to include three or more regulators and three or more clock generation units or delay-locked loops; and may operate similarly as in the above-described operating method.

While certain embodiments have been described above, it will be understood to those skilled in the art that the embodiments described are by way of example only. Accordingly, the clock generation circuit of a semiconductor apparatus described herein should not be limited based on the described embodiments. Rather, the clock generation circuit of a semiconductor apparatus described herein should only be limited in light of the claims that follow when taken in conjunction with the above description and accompanying drawings.

What is claimed is:

1. A clock generation circuit of a semiconductor apparatus, comprising:
   a first delay line configured to delay a first clock and generate a first delayed clock which swings between a level of a power supply voltage and a level of a set voltage;
   a second delay line configured to delay a second clock and generate a second delayed clock which swings between the level of the set voltage and a level of a ground voltage;
   a regulator configured to supply the set voltage to the first delay line and the second delay line;
   a delay modeling unit configured to delay the first delayed clock by a model delay amount and output a delay modeling clock;
   a phase comparison unit configured to compare phases of the first clock and the delay modeling clock and output a comparison signal; and a control unit configured to output a control signal in response to the comparison signal, such that the same delay amount is set for the first delay line and the second delay line.

2. The clock generation circuit according to claim 1, wherein the regulator retains a voltage level of a node which is electrically coupled with the first delay line and the second delay line, at the level of the set voltage.

3. The clock generation circuit according to claim 2, wherein the first delay line is electrically coupled between a terminal of the power supply voltage and the node, and the second delay line is electrically coupled between the node and a terminal of the ground voltage.

4. The clock generation circuit according to claim 1, wherein the level of the set voltage is a half level of the power supply voltage.

5. The clock generation circuit according to claim 1, further comprising:
   a first divider configured to divide an external clock and generate the first clock; and
   a second divider configured to divide an inverted external clock and generate the second clock.

6. The clock generation circuit according to claim 5, further comprising:
   a first splitter configured to receive the first delayed clock and output a first positive delayed clock and a first negative delayed clock generated by inverting the first positive delayed clock; and
   a second splitter configured to receive the second delayed clock and output a second positive delayed clock and a second negative delayed clock generated by inverting the second positive delayed clock.

7. The clock generation circuit according to claim 1, wherein the control unit is configured to control the first delay line and the second delay line in a same manner.

8. A clock generation circuit of a semiconductor apparatus, comprising:
   a first delay line configured to delay a first clock and generate a first delayed clock which swings between a level of a power supply voltage and a level of a set voltage;
   a second delay line configured to delay a second clock and generate a second delayed clock which swings between the level of the set voltage and a level of a ground voltage;
   a regulator configured to supply the set voltage to the first delay line and the second delay line;
   a delay modeling unit configured to delay the second delayed clock by a model delay amount and output a delay modeling clock;
   a phase comparison unit configured to compare phases of the second clock and the delay modeling clock and output a comparison signal; and
   a control unit configured to output a control signal in response to the comparison signal, such that the same delay amount is set for the first delay line and the second delay line.

9. The clock generation circuit according to claim 8, wherein the regulator retains a voltage level of a node which is electrically coupled with the first delay line and the second delay line, at the level of the set voltage.

10. The clock generation circuit according to claim 9, wherein the first delay line is electrically coupled between a terminal of the power supply voltage and the node, and the second delay line is electrically coupled between the node and a terminal of the ground voltage.

11. The clock generation circuit according to claim 8, wherein the level of the set voltage is a half level of the power supply voltage.

12. The clock generation circuit according to claim 8, further comprising:
   a first divider configured to divide an external clock and generate the first clock; and
   a second divider configured to divide an inverted external clock and generate the second clock.

13. The clock generation circuit according to claim 12, further comprising:
   a first splitter configured to receive the first delayed clock and output a first positive delayed clock and a first negative delayed clock generated by inverting the first positive delayed clock; and
   a second splitter configured to receive the second delayed clock and output a second positive delayed clock and a second negative delayed clock generated by inverting the second positive delayed clock.

14. The clock generation circuit according to claim 8, wherein the control unit is configured to control the first delay line and the second delay line in a same manner.

\* \* \* \* \*